United States Patent [19]

White et al.

[11] Patent Number: 4,470,871

[45] Date of Patent: Sep. 11, 1984

[54] PREPARATION OF ORGANIC LAYERS FOR OXYGEN ETCHING

[75] Inventors: Lawrence K. White, Mercer County; Metodi Popov, Hunterdon County, both of N.J.

[73] Assignee: RCA Corporation, New York, N.Y.

[21] Appl. No.: 565,338

[22] Filed: Dec. 27, 1983

[51] Int. Cl.³ .................. B29C 17/08; B44C 1/22; C03C 15/00; C03C 25/06

[52] U.S. Cl. .................... 156/628; 156/646; 156/655; 156/659.1; 156/668; 156/643; 204/192 E; 252/79.1

[58] Field of Search ............ 156/643, 646, 655, 659.1, 156/668, 628; 204/192 E; 252/79.1; 427/38, 39, 40, 41, 43.1; 430/313, 317

[56] References Cited

U.S. PATENT DOCUMENTS 4,240,869  12/1980  Diepers ........................ 156/643
4,333,793   6/1982  Lifshitz et al. ................. 156/643
4,377,437   3/1983  Taylor et al. .................. 156/628
4,430,153   2/1984  Gleason et al. ............. 156/668 X

OTHER PUBLICATIONS

Donohue, Abstract of Paper Given at International Symposia on Plasma Chemistry, Edinburgh, Scotland, 1981.
Ranadive et al., Abstract of Paper Given at Electrochemical Society Spring Meeting, May, 1980.
Dobkin et al., IEEE Device Letters, vol. EDL-2, No. 9, pp. 222–224, Sep., 1981.

Primary Examiner—William A. Powell
Attorney, Agent, or Firm—Birgit E. Morris; R. Hain Swope

[57] ABSTRACT

An improved method of etching a layer of organic material on a sustrate by oxygen plasma or oxygen reactive ion etching is disclosed. The surface of the layer is flood exposed with a plasma including a fluorine species for a time sufficient to significantly reduce the etch rate thereof in the oxygen etch. A patterned mask is then formed on the layer and the exposed portion etched. The subject method produces vertical walls in the etch profile with substantially no rounding of the top edge.

8 Claims, No Drawings

PREPARATION OF ORGANIC LAYERS FOR OXYGEN ETCHING

This invention relates to an improvement in the patterning of organic planarizing or dielectric layers with an oxygen plasma or reactive ion etch.

BACKGROUND OF THE INVENTION

The increasing demand for very-large-scale-integrated (VLSI) devices has made imperative the development of techniques for multilevel metallization, multilayer resist processing, and the like. These developments necessitate utilization of layers of planarizing material to smooth uneven topography on a substrate so that there will be minimal thickness variation in, e.g. a subsequently spun-on coating of resist material. In the instance of multilevel metallization, it is necessary that there be an intermediary layer of dielectric material between metal layers which smooths topography underlying the second-deposited layer of metal and which provides effective insulation between them.

The planarizing layers and, not infrequently the dielectric materials, are organic, i.e., polymeric in nature. It is frequently the case, especially with polyimide dielectrics, that such layers are etched by oxygen plasma or reactive ion etching. Since such layers are generally thick, there is a tendency for the top edge to lose edge acuity, i.e. become less vertical, during prolonged oxygen etching. This often produces a rounded top on the edge of the pattern and a sloped profile. For applications such as multilayer resist structures, liftoff structures and certain high resolution patterns where vertical and reverse-sloped wall profiles are desired, the rounding of the top edge of the patterned layer and undercutting of the masking layer can have adverse effects on dimensional control of the pattern. In accordance with this invention, an effective means of preventing the formation of rounded or sloped wall profiles has been found.

SUMMARY OF THE INVENTION

A planarizing or dielectric layer of organic material on a substrate is treated to maintain its edge acuity during subsequent oxygen plasma or reactive ion etching by flood exposure of the surface with a plasma which includes a fluorine species.

DETAILED DESCRIPTION OF THE INVENTION

The planarizing layer prepared for oxygen plasma or reactive ion etching in accordance with this invention can be any organic resin which meets the criteria for such materials well known in the electronics industry. Such requirements include, in addition to the capacity to smooth uneven topography, stability, chemical and electrical compatibility with the various materials making up a given device, acceptable processing temperatures, and the like. Among preferred materials are those conventionally utilized as photoresists, for example, compositions comprised of a novolak resin and a diazoquinone sensitizer therefor. The organic dielectric layer contemplated herein can be of any material conventionally recognized as being useful in multilevel metallizations, typically a polyimide. It is, of course, possible that a single organic material can function as both a planarizing layer and a dielectric in an electronic device, and such materials are also contemplated herein.

Examples of commercial resist preparations which can be utilized as planarizing materials include HPR 204 and HPR 206 of Hunt Chemical Company, EK809 of Eastman Kodak Company, AZ1470 and AZ1450J of the Shipley Company, and the like. Examples of commercial polyimide preparations which are suitable dielectric materials include PIQ, available from Hitachi Chemical Co. and PI2555, available from E. I. duPont de Nemours and Company.

Generally, the thickness of the organic layers treated in accordace with this invention is from about 1 to about 3 times the height of the highest step in the substrate topography. As the step height is generally not more than about one micrometer, the organic layers are generally not in excess of three, or at the most, four micrometers thick.

The organic planarizing and dielectric layers treated in accordance with this invention are applied to the substrate by conventional methods, preferably by spin-coating, typically at from about 4000 to about 7000 rpm. Adjustments in spin speed, viscosity of the coating preparation and the like which can be made to vary the coating thickness are considered to be within the skill of the art. The layer may be baked prior to the treatment of the subject process, if it is conventional to do so with the particular polymer being used.

The entire surface of the organic layer is then treated in accordance with this invention by flood exposure with a plasma which includes a fluorine species. A preferred plasma is carbon tetrafluoride, although trifluoromethane, silicon hexafluoride, and the like may be used as well. A particularly preferred plasma is a mixture of a source of fluorine species, e.g. carbon tetrafluoride, and oxygen wherein the source of fluorine species predominates. Suitable mixtures comprise from about 50 to 100 percent by volume of the fluorine species-containing gas with the remainder, if any, being oxygen. A preferred mixture is about 95 percent by volume of carbon tetrafluoride and about 5 percent by volume of oxygen.

The plasma treatment of the organic layer is carried out for a time sufficient to form a surface coating thereon which is resistant to oxygen plasma or reactive ion etching. While the thickness of such a coating may vary depending on the content of the organic layer and the extent of plasma treatment, it is generally about 10 to 500 angstroms thick. This coating or film is thought to be a protective polymer formed by reaction of the fluorine species with the polymer surface.

The plasma treatment of this invention is carried out for a time sufficient to significantly lower the etch rate of the surface of the organic layer in oxygen reactive ion etch or plasma. This does not mean that it is contemplated that the organic layer be so resistant to the oxygen plasma or reactive ion etch after treatment that it would be very difficult to etch. The subject treatment toughens the surface so that, once the oxygen etch has removed the affected surface in the desired areas, the top edge of the profile resists eroding while the remainder of the layer is being rapidly etched, thereby producing a vertical wall with a sharp corner at the upper edge of the profile.

Those of ordinary skill in the art will appreciate that the conditions and duration of plasma treatment of the subject method may vary considerably depending on the particular resin of the organic layer, its affinity for the fluorine species in the plasma, and the like. In general, it is contemplated that the subject treatment reduces the etch rate of the surface of the organic layer in oxygen plasma or reactive ion etch by at least about 20 percent.

The plasma treatment of this invention is suitably carried out in a conventional barrel etcher apparatus at from about 100 to about 400 watts, preferably about 300 watts. The pressure is preferably from about 0.1 to about 2.0 torr. Although it may vary with conditions and the particular resin or resins being treated, the plasma treatment of this invention is generally carried out for about 1 to about 30 minutes, preferably for about 5 minutes.

After the subject treatment has been carried out, a patterned layer is deposited over the organic layer and the portion thereof not covered is removed by oxygen plasma or reactive ion etch. Since the oxygen etching rapidly erodes most conventional organic resist materials, the layer formed and patterned over the treated organic layer is preferably a hardmask of material such as silicon dioxide, silicon nitride or a metal such as aluminum. The hardmask layer, after deposition, is patterned, suitably by use of a patterned layer of a conventional resist preparation.

The structure is then placed in a conventional plasma reactor, e.g. a barrel reactor or a plasmatherm parallel plate reactor, or a reactive ion etcher, and the exposed portion of the organic material removed. It has been found that the upper corner of the organic layer treated in accordance with this invention remains sharp and well defined, even after an extended isotropic oxygen etch.

The treatment of this invention is advantageous in that it permits the use of less anisotropic etch conditions to produce near vertical and overhang, i.e. reverse slope, wall profiles. Isotropic etch conditions are preferred for defining an organic planarizing layer where an overhang profile is desired. The subject treatment further permits the use of greater etch rates and allows a substantial reduction in the extent of overetching which might be required for cleaning the sidewalls of steps in the underlying substrate.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A planarizing layer of the positive resist HPR 204 of the Hunt Chemical Company was spin-coated at 4000 rpm onto three inch silicon wafers having a 0.5 micrometer thick coating of polycrystalline silicon to obtain a resist coating 1.3 micrometers thick. The resist layer was flood irradiated with light to react the sensitizer in at least the upper one-third thereof and then backside heated through the substrate to 200° for thirty minutes as disclosed in copending application Ser. No. 458,757, filed Jan. 17, 1983, the disclosure of which is incorporated herein by reference.

One-half of the wafers were placed in a IPC barrel etcher set at 300 watts and a gas pressure of 0.5 torr. The surface of the planarizing layer was treated for 5 minutes utilizing a gas mixture of 95 percent by volume of carbon tetrafluoride and 5 percent by volume of oxygen.

All aluminum hardmask 0.2 micrometer thick was deposited on all substrates with an In-Source evaporator. This layer was, in turn, spin-coated with a layer of positive resist one micrometer thick. The resist layer was irradiated and developed to expose a portion of the hardmask layer. The exposed hardmask was etched with a mixture of nitric and phosphoric acids, thus exposing a corresponding portion of the planarizing layer. The exposed planarizing layer was etched in a conventional plasma reactor using pure oxygen at a pressure of 0.5 torr. Etching was continued until the exposed area of the planarizing layer etched down to the underlying silicon. The aluminum hardmask was then removed using an etchant mixture of nitric acid and phosphoric acid. Examination of the organic layer by electron microscope showed that the walls of the fluoride treated samples were more nearly vertical than the untreated samples and had a slight overhang on the edge of the upper profile. There was virtually no rounding at the edge of the upper profile.

In contrast, the untreated group of substrates showed sloped wall profiles in the planarizing layer and no overhang at the upper corner of the wall profile.

EXAMPLE 2

Three inch silicon wafers having a one micrometer thick coating of aluminum thereon were coated with a 2.0 micrometer thick coating of PI2555, a polyimide resin available from E. I. duPont de Nemours & Co. One half of the wafers were placed into a conventional plasma chamber and flood plasma treated with a carbon tetrafluoride/oxygen mixture as in Example 1.

All wafers were coated with a layer of aluminum 0.2 micrometer thick. A patterned layer of resist was formed thereover, and the aluminum was etched to expose a portion of the polyimide layer.

Etching of the exposed polyimide layer was carried out in a pure oxygen plasma as in Example 1.

The wafers were examined by electron microscope. As was the case in Example 1, those wafers receiving the treatment of this invention showed more vertical wall profiles for the polyimide, and virtually no rounding of the top corner of the wall and minimal undercutting of the aluminum hardmask. The untreated wafers showed a sloped wall profile in the polyimide sublayer and undercutting of the hardmask as is characteristic of isotropic etch conditions. These experiments clearly establish the advantage of the subject invention.

We claim:

1. In a method of forming a pattern in a layer of organic material on a substrate comprising:
   (a) forming on the layer of organic material a patterned layer of a material resistant to oxygen etching, and
   (b) using said patterned layer as a mask, etching the exposed portion of the organic layer with an oxygen plasma etch or an oxygen reactive ion etch, the improvement comprising plasma treating the entire surface of the organic material prior to forming the masking layer thereon with a plasma including a fluorine species for a time sufficient to significantly reduce the etch rate of the surface in an oxygen plasma or oxygen reactive ion etch.

2. An improved method in accordance with claim 1, wherein said plasma includes a fluorine species and oxygen.

3. An improved method in accordance with claim 1, wherein said plasma includes a gas selected from the group consisting of carbon tetrafluoride, trifluoromethane and silicon hexafluoride.

4. An improved method in accordance with claim 2, wherein said plasma is a mixture of carbon tetrafluoride and oxygen.

5. An improved method in accordance with claim 4, wherein said mixture is about 95 parts by volume of carbon tetrafluoride and 5 parts by volume of oxygen.

6. An improved method in accordance with claim 1, wherein said treatment reduces the etch rate of the surface of said organic layer in an oxygen plasma or oxygen reactive ion etch by at least about 20 percent.

7. An improved method in accordance with claim 1, wherein said organic layer is a polyimide dielectric material.

8. An improved method in accordance with claim 1, wherein said organic layer includes a novolac resin and a diazoquinone sensitizer therefor.

* * * * *